(12) United States Patent
Kong et al.

(10) Patent No.: US 12,604,737 B2
(45) Date of Patent: Apr. 14, 2026

(54) ELECTRONIC ASSEMBLY COMPRISING METAL FOIL LAYER EXPOSING SOLDER BUMPS AND METHOD FOR FABRICATING THE SAME

(71) Applicant: 3M INNOVATIVE PROPERTIES COMPANY, St. Paul, MN (US)

(72) Inventors: Jiwoong Kong, Gyeonggi-do (KR); Jung Ju Suh, Seoul (KR)

(73) Assignee: 3M Innovative Properties Company, St. Paul, MN (US)

( * ) Notice: Subject to any disclaimer, the term of this patent is extended or adjusted under 35 U.S.C. 154(b) by 370 days.

(21) Appl. No.: 18/278,681

(22) PCT Filed: Jan. 28, 2022

(86) PCT No.: PCT/IB2022/050766
§ 371 (c)(1),
(2) Date: Aug. 24, 2023

(87) PCT Pub. No.: WO2022/180461
PCT Pub. Date: Sep. 1, 2022

(65) Prior Publication Data
US 2024/0063139 A1 Feb. 22, 2024

(30) Foreign Application Priority Data
Feb. 26, 2021 (KR) ........................ 10-2021-0026758

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/561* (2013.01); *H01L 25/0655* (2013.01); *H01L 23/3128* (2013.01)

(58) Field of Classification Search
CPC . H01L 23/552; H01L 25/0655; H01L 21/561; H01L 25/50; H01L 23/3128;
(Continued)

(56) References Cited

U.S. PATENT DOCUMENTS 7,576,415 B2 8/2009 Cha et al.
9,269,673 B1 * 2/2016 Lin ........................ H01L 23/552
(Continued)

FOREIGN PATENT DOCUMENTS

KR 20140111936 A 9/2014
KR 20170055937 A 5/2017
(Continued)

OTHER PUBLICATIONS

International Search Report received for PCT International Application No. PCT/IB2022/050766, mailed on May 3, 2022, 3 pages.

*Primary Examiner* — Didarul A Mazumder
(74) *Attorney, Agent, or Firm* — Gregg H. Rosenblatt

(57) ABSTRACT

The present disclosure relates to an electronic assembly. Specifically, according to an embodiment of the present disclosure, there is provided an electronic assembly including: a circuit board including a plurality of electric conductive connectors; a plurality of spaced semiconductor integrated circuits coupled to a first main surface of the circuit board; a cover layer disposed on the semiconductor integrated circuit to substantially enclose and to cover the semiconductor integrated circuit; a plurality of solder bumps disposed on a second main surface facing the first main surface of the circuit board in order to provide an electric connection to the electronic assembly; a first metal foil layer comprising a cut portion to expose the solder bump, and bonded to the second main surface of the circuit board; and a metal coating layer which is conformally coated over an upper surface of the electronic assembly on the first main surface of the circuit board, and is extended toward the
(Continued)

second main surface of the circuit board across edges of the electronic assembly in order to physically, electrically contact the metal foil layer, and to coat side surfaces of the electronic assembly.

12 Claims, 9 Drawing Sheets

(51) Int. Cl.
*H01L 23/31* (2006.01)
*H01L 25/065* (2023.01)

(58) Field of Classification Search
CPC ..... H01L 23/49816; H01L 2924/15311; H01L 23/3135; H01L 23/3164
USPC ........................................................ 257/659
See application file for complete search history.

(56) References Cited

U.S. PATENT DOCUMENTS

| | | | |
|---|---|---|---|
| 9,282,630 | B2 | 3/2016 | Merz |
| 9,974,215 | B1 | 5/2018 | Jeong et al. |
| 2014/0145315 | A1 | 5/2014 | Lim |
| 2015/0380361 | A1 | 12/2015 | Lee |
| 2016/0204073 | A1 | 7/2016 | Beak et al. |
| 2017/0012007 | A1 | 1/2017 | Chung et al. |
| 2017/0311448 | A1* | 10/2017 | Kawabata ............. H01L 23/552 |
| 2017/0330839 | A1 | 11/2017 | Kim |
| 2018/0025955 | A1 | 1/2018 | Rusli |
| 2018/0211925 | A1* | 7/2018 | Tsai ......................... H01L 21/52 |
| 2018/0261550 | A1* | 9/2018 | Cho .................... H01L 23/3135 |
| 2019/0164938 | A1 | 5/2019 | Lee |
| 2019/0259526 | A1 | 8/2019 | Yon |
| 2019/0287947 | A1* | 9/2019 | Chen ..................... H01L 21/486 |
| 2020/0006248 | A1 | 1/2020 | Yu |
| 2020/0161252 | A1* | 5/2020 | Yang .................... H01L 21/568 |
| 2020/0279785 | A1* | 9/2020 | Faul ................. H01L 23/49833 |
| 2020/0303320 | A1* | 9/2020 | Kong ................... H01L 23/552 |
| 2024/0371788 | A1 | 11/2024 | Kong |

FOREIGN PATENT DOCUMENTS

| | | | |
|---|---|---|---|
| KR | 10-2017-0120070 | A | 10/2017 |
| KR | 20190101268 | A | 8/2019 |

* cited by examiner

S10

S100

STEP OF FORMING ARTICLE

| STEP OF PPROVIDING CIRCUIT BOARD | ─S110 |

| STEP OF DISPOSING COVER LAYER | ─S120 |

| STEP OF BONDING FIRST METAL FOIL LAYER | ─S130 |

| STEP OF DIVIDING ARTICLE | ─S200 |

| STEP OF FORMING ELECTRIC CONDUCTIVE LAYER | ─S300 |

ELECTRONIC ASSEMBLY COMPRISING METAL FOIL LAYER EXPOSING SOLDER BUMPS AND METHOD FOR FABRICATING THE SAME

CROSS REFERENCE TO RELATED APPLICATIONS

This application is a national stage filing under 35 U.S.C. 371 of PCT/IB2022/050766 filed Jan. 28, 2022, which claims the benefit of Korea Application No. 10-2021-0026758, filed Feb. 26, 2021, the disclosures of which are incorporated by reference in their entireties herein.

TECHNICAL FIELD

The present disclosure relates to an electronic assembly and a method for fabricating the same.

BACKGROUND

In an electronic product, electromagnetic waves which refer to waves in which an electric field and a magnetic field are combined typically occur. Since such electromagnetic waves are generated from the electronic product and propagate toward an external space of the electronic product, the electromagnetic waves are easy to expose to a human body or a device. In particular, when electromagnetic waves are exposed to a user, they are harmful to the human body, and, when electromagnetic waves are exposed to an industrial device and a home appliance, malfunction of the device may be caused.

Accordingly, researches on techniques for blocking electromagnetic waves to prevent electromagnetic waves generated from an electronic product from propagating to the outside of the electronic product are actively ongoing.

In addition, social efforts to protect a human body from electromagnetic waves and to prevent malfunction of a device are being made in various fields, by defining and implementing Electro Magnetic Interference (EMI) certification and Electro Magnetic Susceptibility (EMS) certification.

SUMMARY

Technical Problem

An electric field forming electromagnetic waves may be easily blocked by using a conductor. For example, the electric field may be easily blocked by grounding a roof, a wall or a floor of a building and the like, or using a grounded shielding material.

On the other hand, since the magnetic field forming electromagnetic waves is not easily blocked even by using geographic features unlike the electric field, a special material having high magnetic permeability should be used or a special method should be used. However, the special material and the special method may require an excessive cost and a long processing time.

Accordingly, an embodiment of the present disclosure has been invented based on the above-described background, and provides an electronic assembly which can maximize blocking performance of electromagnetic waves while minimizing a cost required to fabricate.

Technical Solution

According to one aspect of the present disclosure, there is provided an electronic assembly including: a circuit board including a plurality of electric conductive connectors; a plurality of spaced semiconductor integrated circuits coupled to a first main surface of the circuit board; a cover layer disposed on the semiconductor integrated circuit to substantially enclose and to cover the semiconductor integrated circuit; a plurality of solder bumps disposed on a second main surface facing the first main surface of the circuit board in order to provide an electric connection to the electronic assembly; a first metal foil layer including a cut portion to expose the solder bump, and bonded to the second main surface of the circuit board; and a metal coating layer which is conformally coated over an upper surface of the electronic assembly on the first main surface of the circuit board, and is extended toward the second main surface of the circuit board across edges of the electronic assembly in order to physically, electrically contact the metal foil layer, and to coat side surfaces of the electronic assembly, wherein the semiconductor integrated circuit is electrically connected with the electric conductive connector and the solder bump, wherein the first metal foil layer and the cover layer have a length and a width which are substantially coextensive with the circuit board.

In addition, there is provided an electronic assembly including: a circuit board including a plurality of electric conductive connectors, and at least one electric conductive ground connector extended toward a side surface of the electronic assembly; first and second semiconductor integrated circuits coupled to a first main surface and a second main surface of the circuit board that face each other, respectively; first and second cover layers which substantially enclose and planarize the first and second semiconductor integrated circuits, respectively, and are disposed on the first and second semiconductor integrated circuits, respectively; a plurality of solder bumps disposed on the second main surface of the circuit board in order to provide an electric connection to the electronic assembly; a first metal foil layer bonded to the second cover layer; and a metal coating layer which is conformally coated over an upper surface of the electronic assembly on the first main surface of the circuit board, and is extended toward the second main surface of the circuit board across edges of the electronic assembly in order to physically, electrically contact the metal foil layer and the ground connector, and to coat the side surfaces of the electronic assembly, wherein the semiconductor integrated circuit is electrically connected with the electric conductive connector and the solder bump, wherein the first metal foil layer, the cover layer include cut portions which are substantially aligned to expose the solder bump, wherein the first metal foil layer, the first and second cover layers have a length and a width which are substantially coextensive with the circuit board.

Advantageous Effects

In an embodiment of the present disclosure, there is an effect of minimizing a cost required to fabricate an electronic assembly.

In addition, in an embodiment of the present disclosure, there is an effect of maximizing blocking performance of electromagnetic waves.

DETAILED DESCRIPTION

Figure 1:
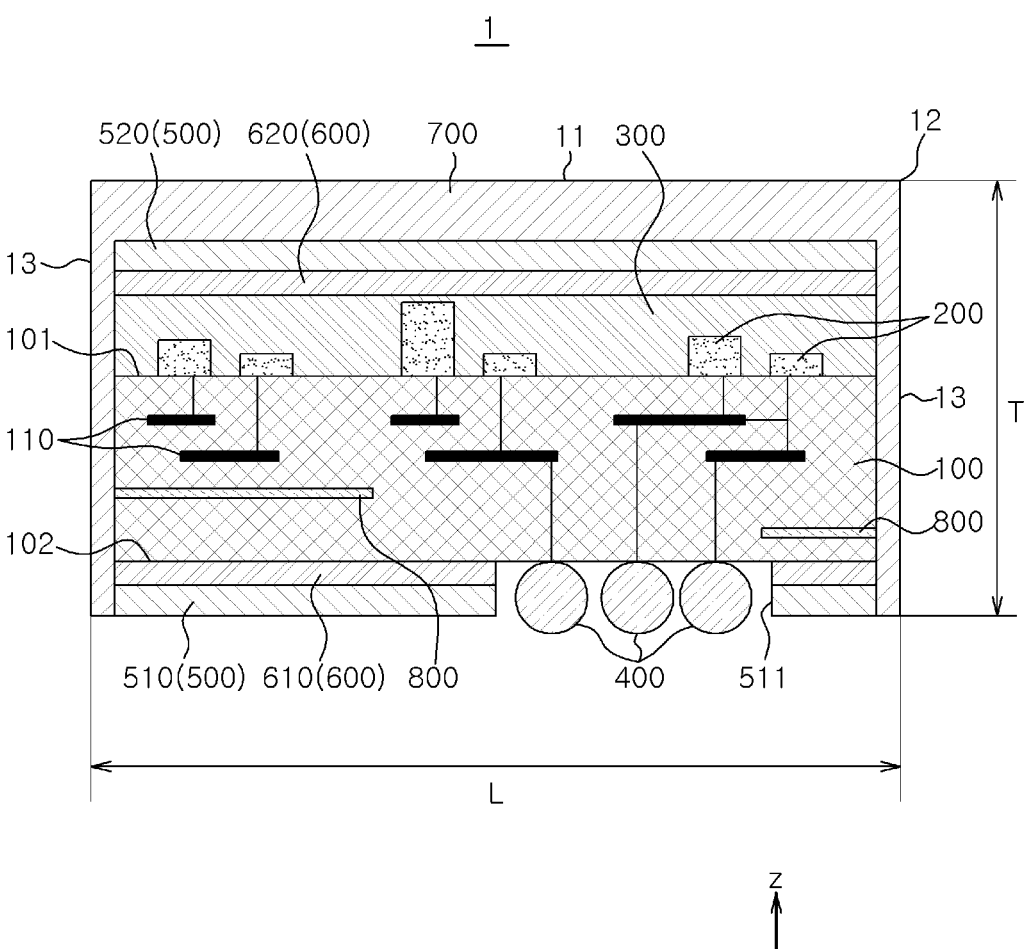
FIG. 1 is a longitudinal cross-sectional view of an electronic assembly according to a first embodiment of the present disclosure.

Hereinafter, specific embodiments for implementing the technical concept of the present disclosure will be described in detail with reference to the drawings.

Further, in explaining the present disclosure, any specific explanation on a well-known related configuration or function deemed to obscure the gist of the present disclosure will be omitted.

In addition, it should be understood that, when a certain element is referred to as being 'connected to,' 'coupled to,' or 'in contact with' another element, the certain element can be directly connected to, coupled to, or in contact with another element, but there may be an intervening element therebetween.

The terms used herein are only for describing certain exemplary embodiments, and not intended to limit the scope of the disclosure. Unless otherwise specified, a singular expression includes a plural expression.

In addition, throughout the description, the expressions "upper side," "lower side," "side surface" or the like are described with reference to illustrations in the drawings, and it is to be noted that these may be expressed differently when the orientation of a corresponding object is changed. For the same reason, some element may be exaggerated, omitted or schematically illustrated in the drawings, and the size of each element does not entirely reflect a real size.

In addition, the terms including ordinal numbers such as 'first' and 'second' may be used to describe various elements, but these elements should not be limited by such terms. These terms are used for the purpose of distinguishing one element from another element only.

The term "includes" used in this specification specifies a specific feature, area, integer, step, operation, element, and/or component, and does not preclude the presence or addition of other specific features, areas, integers, steps, operations, elements, components, and/or groups.

In addition, throughout the descriptions, the expressions regarding a direction, such as "upper side" or the like, are described with reference to illustrations in the drawings, and it is to be noted that these may be expressed differently when the orientation of a corresponding object is changed. On the other hand, in the detailed descriptions, a longitudinal direction may refer to an x-axis direction of FIGS. 1 to 5, and a widthwise direction may refer to a y-axis direction of FIGS. 1 to 5. In addition, a thickness direction may refer to a z-axis direction of FIGS. 1 to 5.

Hereinafter, a detailed configuration of an electronic assembly 1 according to a first embodiment of the present disclosure will be described with reference to the drawings.

Hereinafter, referring to FIG. 1, the electronic assembly 1 according to the first embodiment may protect an electronic component such as a semiconductor element from the outside, and may be electrically connected with an external configuration. In addition, the electronic assembly 1 may have at least part thereof shielded to prevent electromagnetic waves from being discharged to the outside. The electronic assembly 1 may include an upper surface 11, an edge 12, and a side surface 13.

The upper surface 11 refers to one surface of an upper side of the electronic assembly 1. The upper surface 11 may be extended in the longitudinal direction and the widthwise direction.

The edge 12 refers to an edge portion between the upper surface 11 and the side surface 13 of the electronic assembly 1. The edge 12 may be plural in number, and the plurality of edges 12 may be provided on both sides of the electronic assembly 1 in the longitudinal direction.

The side surface 13 refers to both side surfaces of the electronic assembly 1 in the longitudinal direction. The side surface 13 may be extended in the thickness direction. In addition, the side surface 13 may be plural in number.

Figure 2:
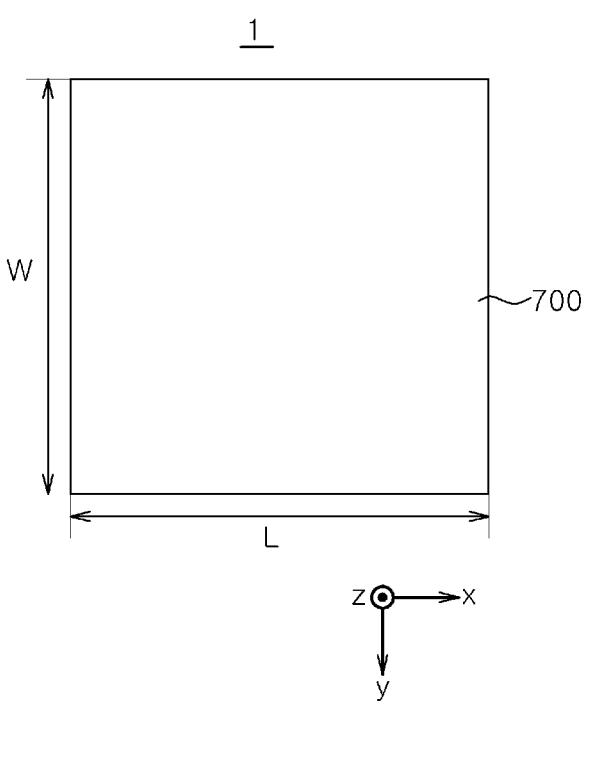
FIG. 2 is a top view of FIG. 1.
Figure 3:
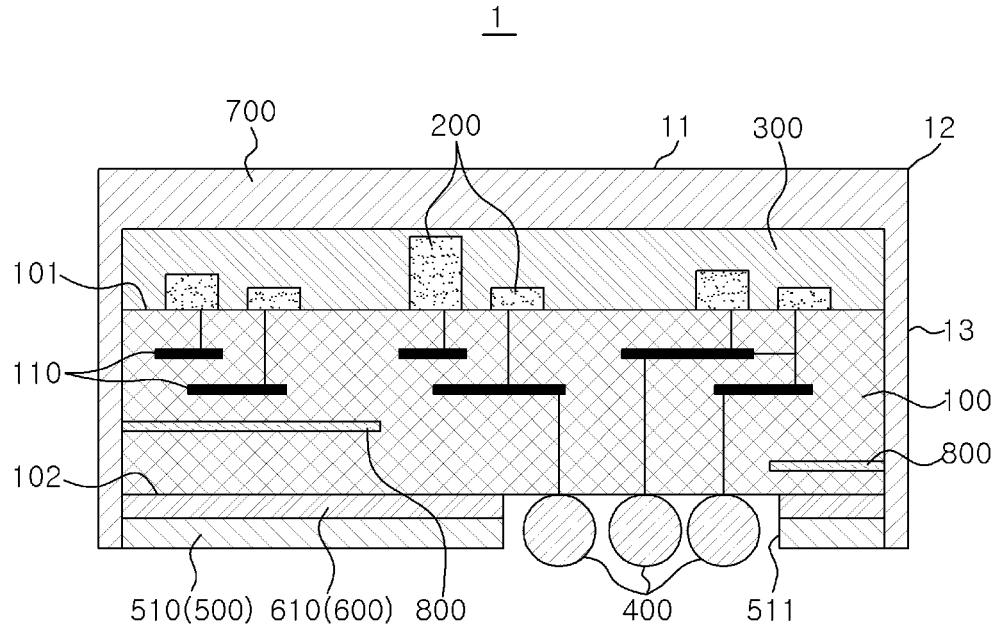
FIG. 3 is a longitudinal cross-sectional view of an electronic assembly according to a second embodiment of the present disclosure.
Figure 3:
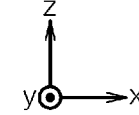
Figure 4:
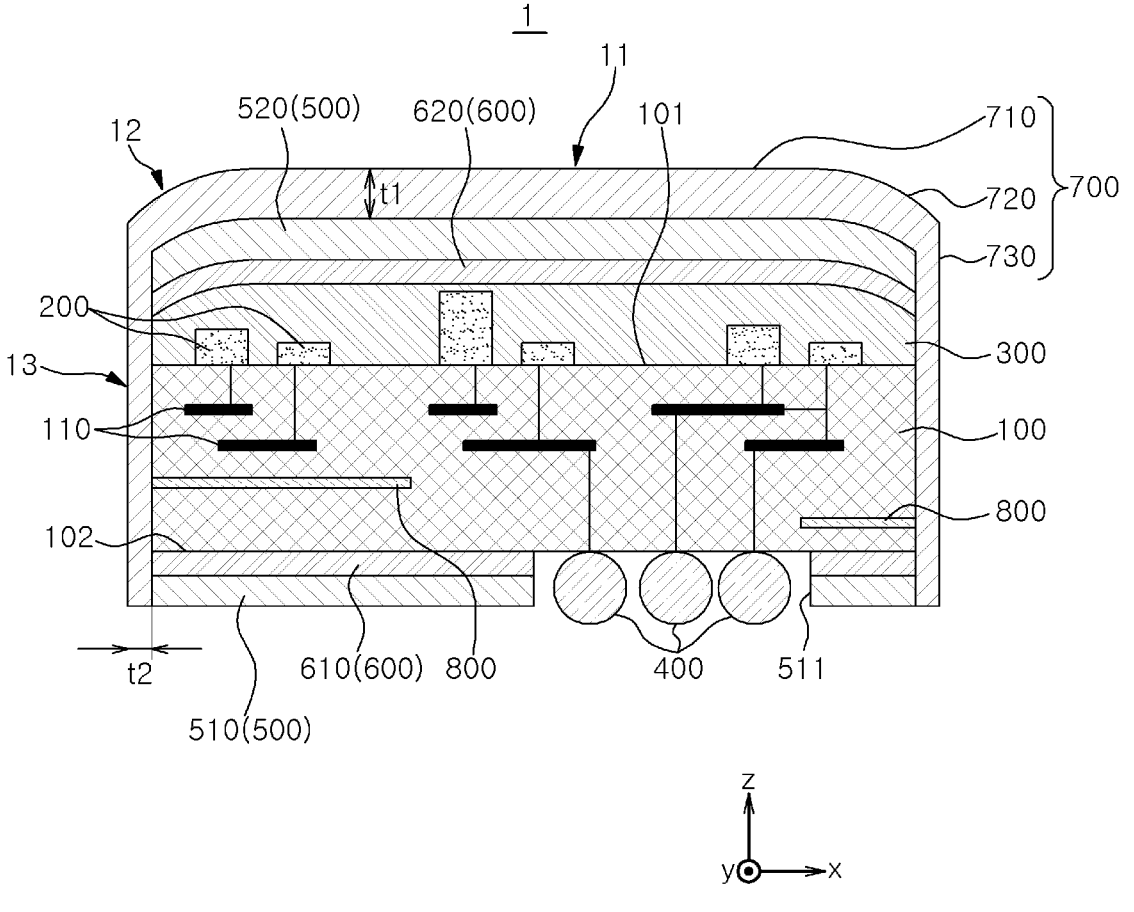
FIG. 4 is a longitudinal cross-sectional view of an electronic assembly according to a third embodiment of the present disclosure.
Figure 5:
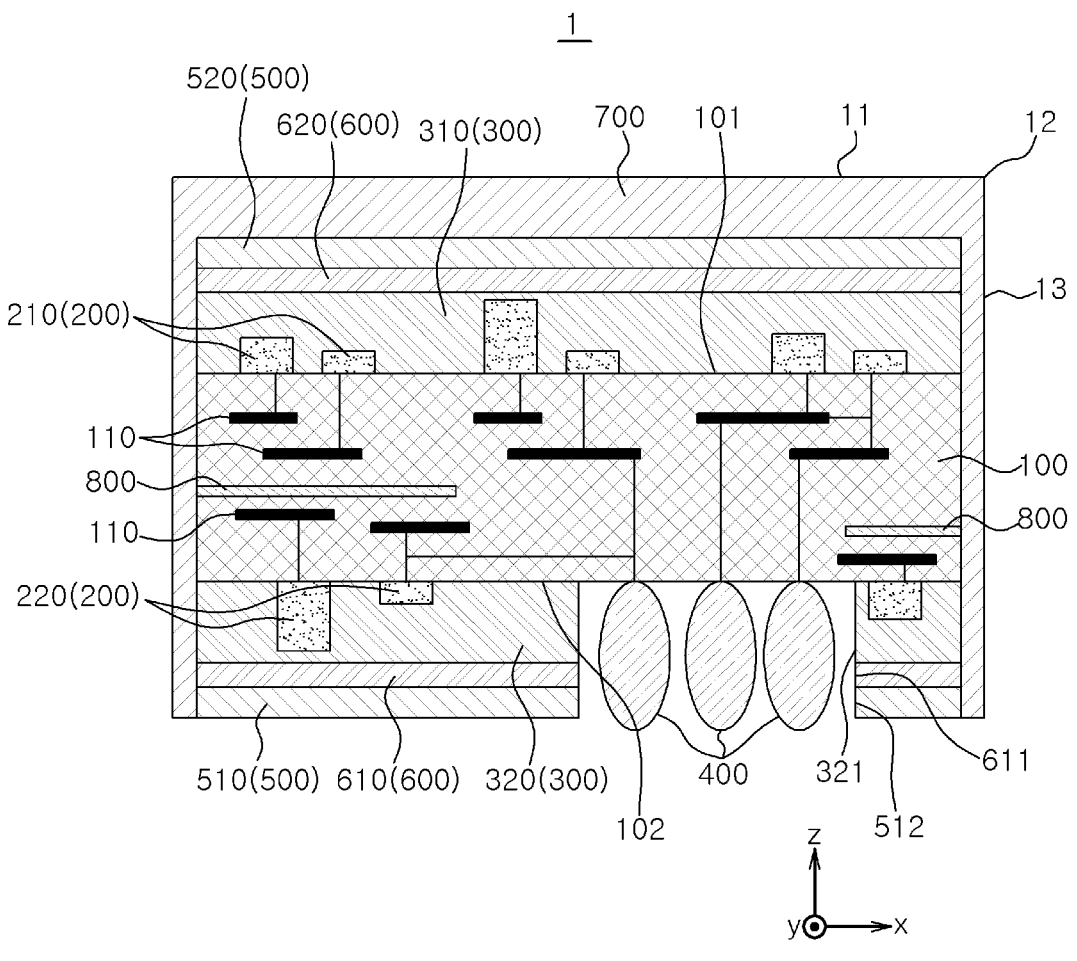
FIG. 5 is a longitudinal cross-sectional view of an electronic assembly according to a fourth embodiment of the present disclosure.

Referring to FIGS. 1 and 2, as well, the electronic assembly 1 may have a predetermined length L, a width W, and a thickness T.

On the other hand, the electronic assembly 1 may include a circuit board 100, a semiconductor integrated circuit 200, a cover layer 300, a solder bump 400, a metal foil layer 500, an adhesive layer 600, a metal coating layer 700, and an electric conductive ground connector 800.

The circuit board 100 may be provided to have various kinds of electronic components mounted thereon. For example, the circuit board 100 may be a printed circuit board (PCB). In addition, the circuit board 100 may have a first main surface 101 and a second main surface 102.

The first main surface 101 refers to an upper surface of the circuit board 100, and the second main surface 102 refers to a bottom surface of the circuit board 100.

On the other hand, the circuit board 100 may include an electric conductive connector 110.

The electric conductive connector 110 may include a material having electric conductivity to allow a current to flow therethrough. In addition, the electric conductive connector 110 may be connected with one or more of the first main surface 101 and the second main surface 102, and may be inserted into the circuit board 100. For example, electronic components disposed on or in the circuit board 100 may exchange electric signals with the electric conductive connector 110.

The electric conductive connector 110 may be plural in number, and some of the plurality of electric conductive connectors 110 may be disconnected from each other. In addition, some of the plurality of electric conductive connectors 110 may be electrically connected with each other. At least two electric conductive connectors 110 of the plurality of electric conductive connectors 110 may be electrically connected to the same semiconductor integrated circuit 200.

The semiconductor integrated circuit 200 may perform various functions as an electronic element. The semiconductor integrated circuit 200 may be coupled to the first main surface 101 on the first main surface 101 of the circuit board 100. In addition, the semiconductor integrated circuit 200 may be plural in number, and the plurality of semiconductor integrated circuits 200 may be spaced apart from one another along the longitudinal direction. The plurality of semiconductor integrated circuits 200 may be electrically connected to the different electric conductive connectors 110, respectively. In addition, the semiconductor integrated circuit 200 may be electrically connected with the solder bump 400 via the electric conductive connector 110.

The semiconductor integrated circuit 200 may have at least part thereof enclosed by the cover layer 300. For example, one of the other surfaces of the semiconductor integrated circuit 200 except for the bottom surface contacting the first main surface 101 may be enclosed by the cover layer 300. The semiconductor integrated circuit 200 may be referred to as a semiconductor IC.

The cover layer 300 may cover the plurality of semiconductor integrated circuits 200. In addition, the cover layer 300 may substantially planarize the semiconductor integrated circuit 200 by enclosing the plurality of semiconductor integrated circuits 200, respectively. Herein, planarizing the semiconductor integrated circuit 200 may refer to the plurality of semiconductor integrated circuits 200 having different sizes being enclosed by the cover layer 300 which has a planar upper surface. Accordingly, other configurations may be disposed on the planar upper surface of the cover layer 300.

In addition, the cover layer 300 may substantially encapsulate the plurality of semiconductor integrated circuits 200, respectively. Herein, encapsulating the semiconductor integrated circuit 200 may refer to the cover layer 300 covering and substantially enclosing the other surfaces except for the bottom surface of the semiconductor integrated circuit 200. The cover layer 300 described above may be in contact with the circuit board 100, and may be disposed on the circuit board 100. For example, the cover layer 300 may include an epoxy molding compound (EMC). In addition, the cover layer 300 may have a length L and a width W which are substantially coextensive with the circuit board 100.

The solder bump 400 may provide an electric connection to the electronic assembly 1. The solder bump 400 may be disposed on the second main surface 102 of the circuit board 100. In addition, the solder bump 400 may be disposed inside a cut portion 511, which will be described below, and may be exposed to the outside through the cut portion 511. In addition, the solder bump 400 may be plural in number, and the plurality of solder bumps 400 may be electrically connected with the electric conductive connectors 110.

The metal foil layer 500 may block electromagnetic waves emitted from the semiconductor integrated circuit 200. For example, the metal foil layer 500 may include one or more of copper (Cu) and stainless steel (SUS). The metal foil layer 500 may include a first metal foil layer 510 and a second metal foil layer 520.

The first metal foil layer 510 may be bonded to the second main surface 102 of the circuit board 100. Herein, the first metal foil layer 510 being bonded to the second main surface 102 may be a concept including not only being bonded in direct contact with the second main surface 102 but also being bonded to the second main surface 102 through a first adhesive layer 610. The first metal foil layer 510 may be exposed to the outside.

The first metal foil layer 510 may include the cut portion 511 to expose the solder bump 400. The cut portion 511 may be formed by penetrating through the first metal foil layer 510 in the thickness direction.

The second metal foil layer 520 may be bonded to the cover layer 300. Herein, the second metal foil layer 520 being bonded to the cover layer 300 may be a concept including not only being bonded in direct contact with the cover layer 300 but also being bonded to the cover layer 300 through a second adhesive layer 620. In addition, the second metal foil layer 520 may be in contact with the metal coating layer 700, and may be disposed between the metal coating layer 700 and the cover layer 300.

The first metal foil layer 510 and the second metal foil layer 520 may have a length L and a width W which are substantially coextensive with the circuit board 100.

The adhesive layer 600 may perform a function of an adhesive. For example, the adhesive layer 600 may include an epoxy resin. The adhesive layer 600 may include the first adhesive layer 610 and the second adhesive layer 620.

The first adhesive layer 610 may be disposed between the first metal foil layer 510 and the circuit board 100, and may be bonded to the first metal foil layer 510 and the second main surface 102 of the circuit board 100.

The second adhesive layer 620 may be disposed between the second metal foil layer 520 and the cover layer 300, and may be bonded to the second metal foil layer 520 and the cover layer 300.

The metal coating layer 700 may block an electric field emitted from the semiconductor integrated circuit 200 or moving toward the semiconductor integrated circuit 200 from the outside. The metal coating layer 700 may be conformally coated over the second metal foil layer 520. In other words, the metal coating layer 700 may be coated over an upper surface of the second metal foil layer 520. The metal coating layer 700 may be extended toward the second main surface 102 across the edges 12 to coat both side surfaces 13 of the electronic assembly 1. That is, the metal coating layer 700 may be extended in the widthwise direction to cover side surfaces of the circuit board 100, the cover layer 300, the metal foil layer 500, and the adhesive layer 600 in the longitudinal direction. In addition, the metal coating layer 700 may be extended in the widthwise direction to physically, electrically contact the first metal foil layer 510.

The metal coating layer 700 may have a length L and a width W which are substantially coextensive with the circuit board 100. In addition, the metal coating layer 700 may have a predetermined thickness. Herein, the thickness of the metal coating layer 700 may vary according to a region of the metal coating layer 700, and the thickness of the metal coating layer 700 may refer to a thickness at a predetermined point, not an average thickness. For example, the metal coating layer 700 may have different from each other thicknesses on the upper surface 11 and on the side surface 13. In addition, the thickness of the metal coating layer 700 may be smaller than about 30 micron, and may be larger than about 0.5 micron. More preferably, the thickness of the metal coating layer 700 may be smaller than about 20 micron, and may be larger than about 1 micron. The metal coating layer 700 may have different from each other an upper average thickness t1 on the upper surface 11, and a side average thickness t2 on the side surface 13. For example, an average thickness ratio t1/t2 of the upper average thickness t1 to the side average thickness t2 of the metal coating layer 700 may exceed 0.2 and may be less than or equal to 0.5.

The electric conductive ground connector 800 may be embedded in the circuit board 100. The electric conductive ground connector 800 may be extended from the inside of the circuit board 100 toward the metal coating layer 700 to physically, electrically contact the metal coating layer 700. In other words, the electric conductive ground connector 800 may be extended in the longitudinal direction to have one end thereof contact the metal coating layer 700. The electric conductive ground connector 800 may be plural in number, and the plurality of electric conductive ground connectors 800 may be disconnected from each other.

According to a second embodiment of the present disclosure, the second metal foil layer 520 and the second adhesive layer 620 may be omitted in addition to the above-described configuration. Hereinafter, the second embodiment of the present disclosure will be described with further reference to FIG. 3. In describing the second embodiment, differences from the above-described embodiment are mainly described, and the same description and reference numerals as in the above-described embodiment are referred to.

The metal coating layer 700 may be disposed on the cover layer 300, and may be directly bonded to the cover layer 300. The metal coating layer 700 may be conformally coated over the cover layer 300. In addition, the metal coating layer 700 may be extended toward the first metal foil layer 510 from the upper surface of the cover layer 300 across the edges 12.

According to a third embodiment of the present disclosure, the metal coating layer 700 may include a center portion 710, a side portion 720, and a taper portion 730, in addition to the above-described configuration. Hereinafter, the third embodiment of the present disclosure will be described with further reference to FIG. 4.

The center portion 710 may be a portion of the metal coating layer 700 that corresponds to at least part of the upper surface 11 of the electronic assembly 1. For example, the center portion 710 may be enclosed by the taper portion 730, and may refer to a portion of the metal coating layer 700 that is adjacent to a center of the second metal foil layer 520. The center portion 710 described above may be extended in the longitudinal direction and the widthwise direction. In addition, the center portion 710 may be a substantially planar surface.

The side portion 720 may be portions of the metal coating layer 700 that correspond to both side surfaces of the electronic assembly 1. The side portion 720 may be extended in the thickness direction.

The taper portion 730 may be a portion of the metal coating layer 700 that is between the center portion 710 and the side portion 720. One end of the taper portion 730 may be connected with the metal coating layer 700, and the other end may be connected with the side portion 720. For example, the taper portion 730 may have a predetermined slope to have a tapering shape. In addition, the taper portion 730 may taper toward the edge 12 of the electronic assembly 1 from the center portion, thereby having its thickness reduced. In other words, a thickness of one side of the taper portion 730 that is connected with the center portion 710 may be larger than a thickness of one side that is connected with the side portion 720.

According to a fourth embodiment of the present disclosure, the semiconductor integrated circuit 200 may include a first semiconductor integrated circuit 210 and a second semiconductor integrated circuit 220, in addition to the above-described configuration. Hereinafter, the fourth embodiment of the present disclosure will be described by referring to FIG. 5 more.

The first semiconductor integrated circuit 210 may be coupled with the circuit board 100 on the first main surface 101 of the circuit board 100. The first semiconductor integrated circuit 210 may be plural in number, and the plurality of first semiconductor integrated circuits 210 may be spaced apart from each other along the longitudinal direction.

The second semiconductor integrated circuit 220 may be coupled with the circuit board 100 on the second main surface 102 of the circuit board 100. The second semiconductor integrated circuit 220 may be plural in number, and the plurality of second semiconductor integrated circuits 220 may be spaced apart from each other along the longitudinal direction.

The cover layer 300 may include a first cover layer 310 and a second cover layer 320 which have a length L and a width W substantially coextensive with the circuit board 100.

The first cover layer 310 may be disposed on an upper side of the circuit board 100, and may cover the plurality of first semiconductor integrated circuits 210. In addition, the first cover layer 310 may planarize the plurality of first semiconductor integrated circuits 210 by enclosing the plurality of first semiconductor integrated circuits 210, respectively.

The second cover layer 320 may be disposed on a lower side of the circuit board 100, and may cover the plurality of second semiconductor integrated circuits 220. In addition, the second cover layer 320 may planarize the plurality of second semiconductor integrated circuits 220 by enclosing the plurality of second semiconductor integrated circuits 220, respectively.

On the other hand, the second cover layer 320 may include a cover cut portion 321, and the first metal foil layer 510 may include a foil cut portion 512. In addition, the first adhesive layer 610 may include an adhesive cut portion 611.

The cover cut portion 321 may be formed by penetrating through the second cover layer 320, and the foil cut portion 512 may be formed by penetrating through the first metal foil layer 510. In addition, the adhesive cut portion 611 may be formed by penetrating through the first adhesive layer 610. For example, the cover cut portion 321, the foil cut portion 512, and the adhesive cut portion 611 may have the same size and shape.

The second cover layer 320, the first metal foil layer 510, and the first adhesive layer 610 may be aligned such that the cover cut portion 321, the foil cut portion 512, and the adhesive cut portion 611 are placed on positions corresponding to one another. The cover cut portion 321, the foil cut portion 512, and the adhesive cut portion 611 may be referred to as a cut portion, and the cut portion may be a concept that includes the cover cut portion 321, the foil cut portion 512, and the adhesive cut portion 611.

The solder bump 400 may be plural in number, and may be disposed inside the cut portion. Accordingly, the plurality of solder bumps 400 may be exposed to the outside through the cut portion.

The first adhesive layer 610 may be disposed between the first metal foil layer 510 and the second cover layer 320, and may be bonded to the first metal foil layer 510 and the second cover layer 320.

Hereinafter an electronic assembly fabrication method S10 for fabricating the electronic assembly 1 according to embodiments of the present disclosure will be described with reference to FIGS. 6 to 12. In addition, regarding the above-described configurations, the same names and the reference numerals are recited.

The electronic assembly fabrication method S10 may fabricate a plurality of electronic assemblies 1. The electronic assembly fabrication method S10 may include a step of forming an article S100, a step of dividing the article S200, and a step of forming an electric conductive layer S300.

At the step of forming the article S100, the article 2 may be formed. The article 2 may be divided into a plurality of divided articles 20 by the step of dividing the article S200. The step of forming the article S100 may include a step of providing a circuit board S110, a step of disposing a cover layer S120, and a step of bonding a first metal foil layer S130.

Figure 6:
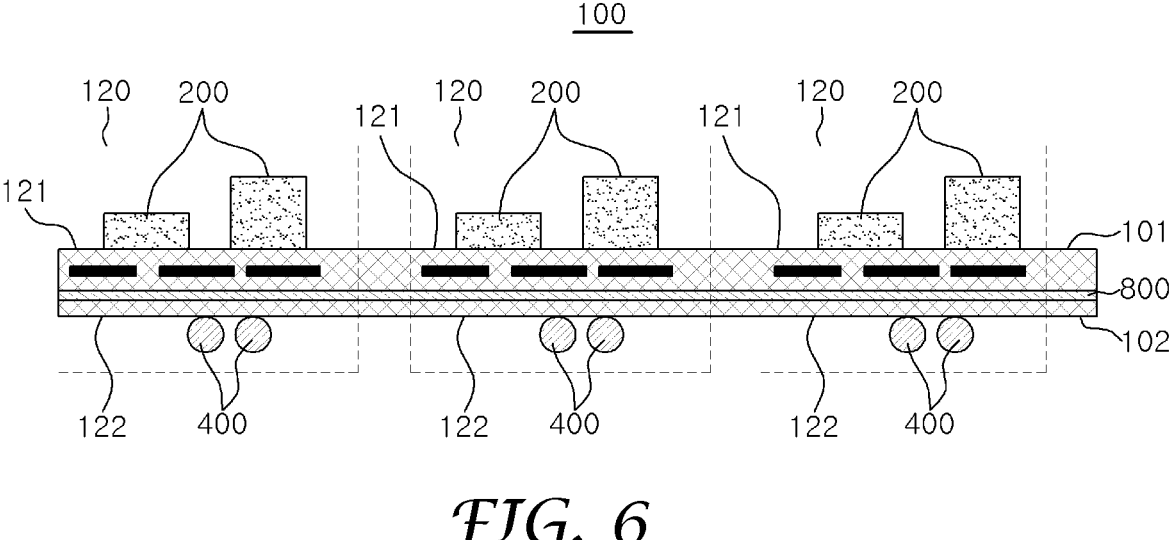
FIG. 6 is a view illustrating a circuit board at a step of providing a circuit board of the present disclosure.

Referring to FIG. 6, at the step of providing the circuit board S110, the circuit board 100 including a plurality of segments 120 may be provided. The circuit board 100 may have a first main surface 101 and a second main surface 102 which face each other. Herein, the first main surface 101 may refer to an upper surface of the circuit board 100, and the second main surface 102 may refer to a lower surface of the circuit board 100.

The segment 120 may include a first side portion 121 and a second side portion 122. Herein, the first side portion 121 of the segment 120 may refer to a part of the first main surface 101 of the circuit board 100, and the second side portion 122 may refer to a part of the second main surface 102 of the circuit board 100.

In addition, each of the plurality of segments 120 may include a semiconductor integrated circuit 200, a solder bump 400, and an electric conductive ground connector 800.

The semiconductor integrated circuit 200 may be coupled to the first side portion 121 of the segment 120. The semiconductor integrated circuit 200 may be plural in number, and the plurality of semiconductor integrated circuits 200 may be spaced apart from each other.

The solder bump 400 may be disposed on the second side portion 122 of the segment 120. The solder bump 400 may be plural in number.

The electric conductive ground connector 800 may be embedded in the segment 120. In addition, the electric conductive ground connector 800 of at least one divided article 20 may physically, electrically contact an electric conductive layer 900 which is coated over side surfaces 13 of the divided article 20, which will be described below. The electric conductive ground connector 800 of the at least one divided article 20 may be extended toward one or more of the side surfaces 13 of the divided article 20.

Figure 7:
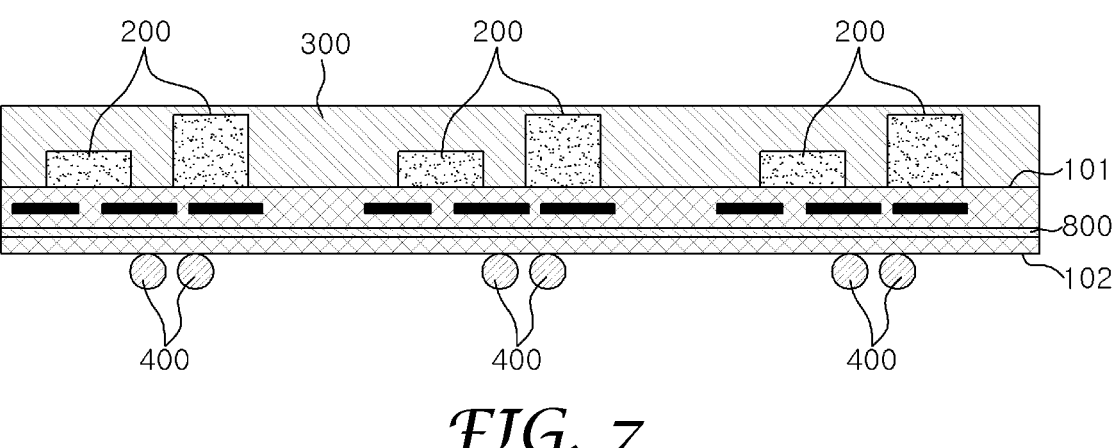
FIG. 7 is a view illustrating a cover layer disposed on a circuit board at a step of disposing a cover layer of the present disclosure.

Referring to FIG. 7, at the step of disposing the cover layer S120, a cover layer 300 may be disposed on the circuit board 100 to cover the semiconductor integrated circuit 200 in each segment 120.

Figure 8:
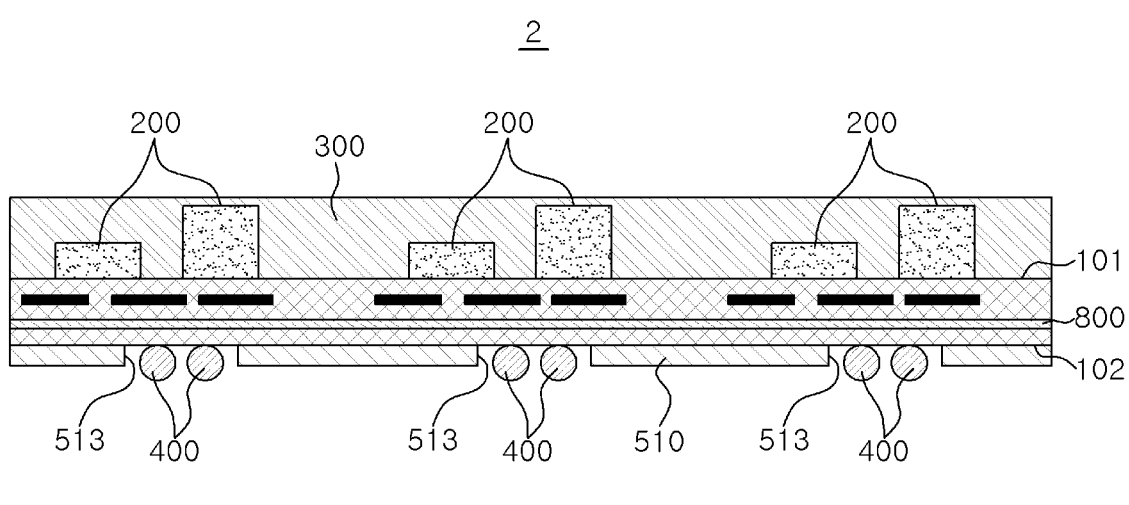
FIG. 8 is a view illustrating a first metal foil layer bonded onto a circuit board at a step of bonding a first metal foil layer of the present disclosure.
Figure 9:
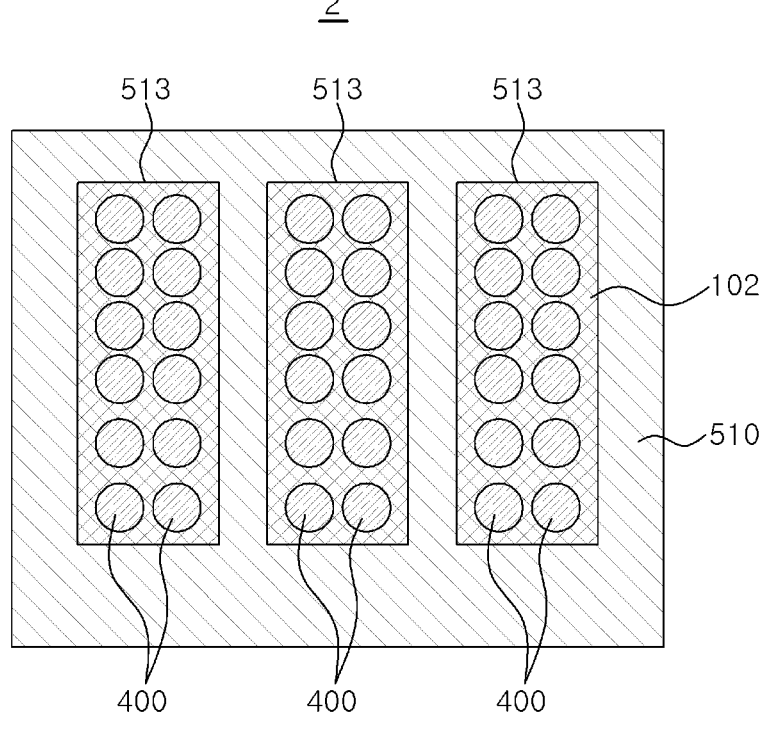
FIG. 9 is a top view of FIG. 8.

Referring to FIGS. 8 and 9, at the step of bonding the first metal foil layer S130, a first metal foil layer 510 including a plurality of penetrating holes 513 may be bonded to the circuit board 100. At the step of bonding the first metal foil layer S130, the first metal foil layer 510 may be bonded to the second side portion 122 of each segment 120, and may cover the second side portion 122. In addition, at the step of bonding the first metal foil layer S130, the plurality of solder bumps 400 may be exposed to the outside through the plurality of penetrating holes 513.

Figure 10:
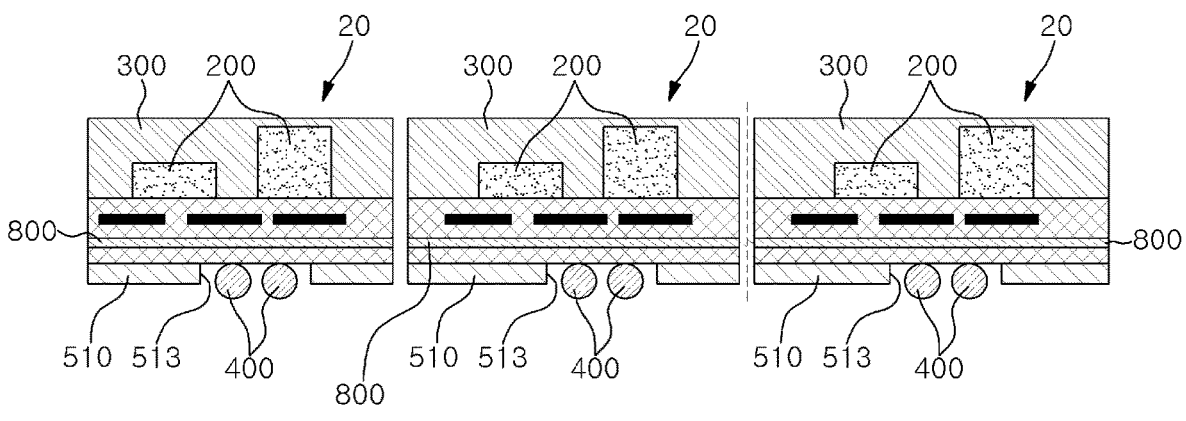
FIG. 10 is a view illustrating a plurality of articles divided at a step of dividing an article of the present disclosure.

Referring to FIG. 10, at the step of dividing the article S200, the article 2 may be divided into the plurality of respective divided articles 20. The divided article 20 may include at least one segment 120. The step of dividing the article S200 may include one or more processes of saw cutting, laser cutting, water jet cutting, die cutting, scoring, and breaking.

The saw cutting may cut the article by using a rotating disc, and the laser cutting may cut the article by irradiating lasers of high energy. In addition, the water jet cutting may cut the article by spraying water of high pressure through a nozzle, and the die cutting may cut the article in a shape of a mold by using a mold having a predetermined shape. In addition, the scoring may cut the article by using a scoring blade, and the breaking may cut the article by breaking.

Figure 11:
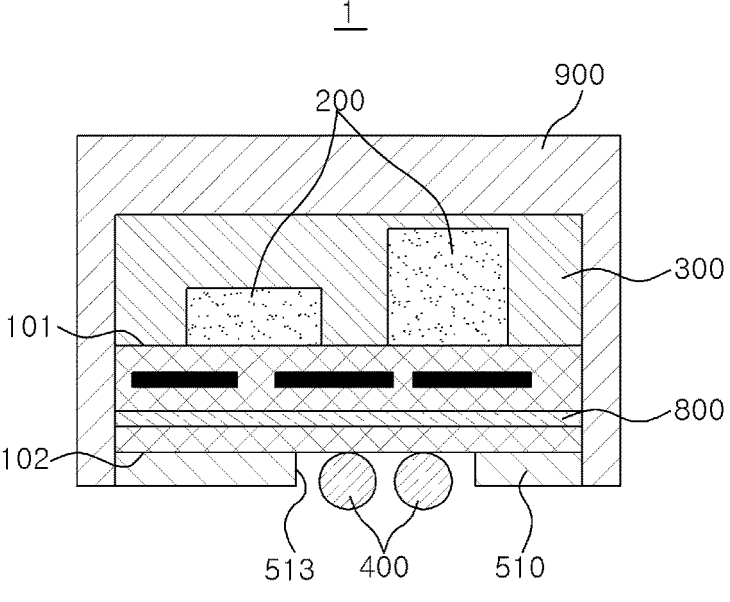
FIG. 11 is a view illustrating an electronic assembly fabricated by an electronic assembly fabrication method of the present disclosure.
Figure 12:
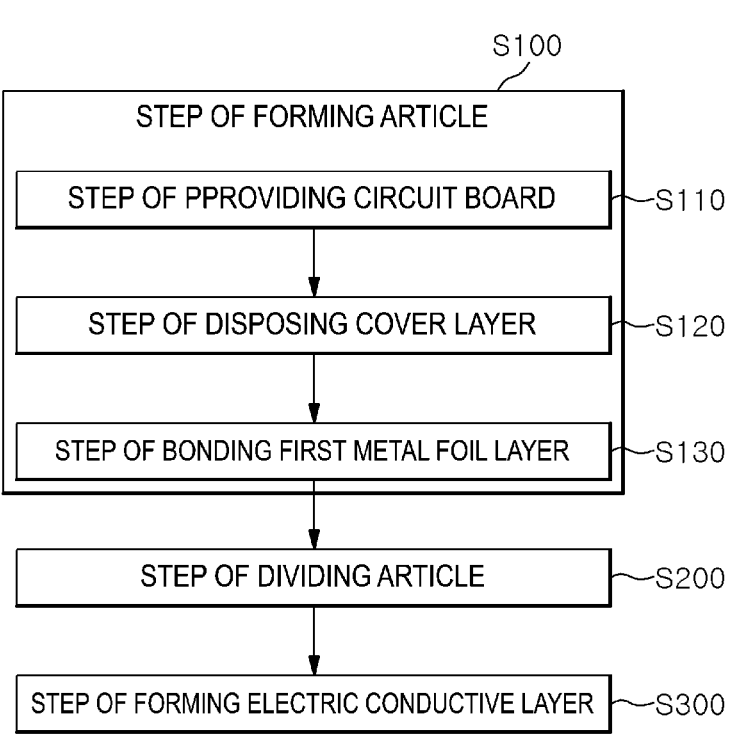
FIG. 12 is a sequence diagram illustrating a method for fabricating an electronic assembly sequentially according to embodiments of the present disclosure.

Referring to FIG. 11, at the step of forming the electric conductive layer S300, the electric conductive layer 900 including metal may be formed on an upper surface of the divided article 20. At the step of forming the electric conductive layer S300, the electric conductive layer 900 may physically, electrically contact the first metal foil layer 510. In addition, the electric conductive layer 900 may be electrically extended, continuously going over the side surfaces 13 of the at least divided article 20 and upper edges 12 of the divided article 20. The electric conductive layer 900 may be disposed on an upper surface 11 of the at least one divided article 20. Herein, the upper surface 11 of the divided article 20 may be the opposite surface of the first metal foil layer 510.

At the step of forming the electric conductive layer S300, the divided article 20 having the electric conductive layer 900 disposed on the upper surface thereof may be referred to as the electronic assembly 1.

As described above, the electronic assembly 1 according to embodiments of the present disclosure includes the metal foil layer 500 and the metal coating layer 700, thereby having an effect of blocking electromagnetic waves.

In addition, masking for exposing the solder bump 400 to the outside may be performed by using the step of bonding the first metal foil layer S130, without using a sputtering process requiring use of a tape, so that there is an effect of noticeably reducing a manufacturing process and a cost.

What is claimed is:

1. An electronic assembly comprising:
a circuit board comprising a plurality of electric conductive connectors;
a plurality of spaced semiconductor integrated circuits coupled to a first main surface of the circuit board;
a cover layer disposed on the plurality of spaced semiconductor integrated circuits to substantially enclose and to cover the plurality of spaced semiconductor integrated circuits;
a plurality of solder bumps disposed on a second main surface facing the first main surface of the circuit board in order to provide an electric connection to the electronic assembly;
a first metal foil layer comprising a cut portion to expose the plurality of spaced solder bumps, and bonded to the second main surface of the circuit board; and
a metal coating layer which is conformally coated over an upper surface of the electronic assembly on the first main surface of the circuit board, and is extended toward the second main surface of the circuit board across edges of the electronic assembly in order to physically, electrically contact the first metal foil layer, and to coat side surfaces of the electronic assembly,
wherein the plurality of spaced semiconductor integrated circuits is electrically connected with the plurality of spaced electric conductive connectors and the plurality of spaced solder bumps, wherein the first metal foil layer and the cover layer have a length and a width which are substantially coextensive with the circuit board.

2. The electronic assembly of claim 1, further comprising: a first adhesive layer, wherein the first metal foil layer is bonded to the second main surface of the circuit board through the first adhesive layer.

3. The electronic assembly of claim 1, wherein a thickness of the metal coating layer is smaller than 30 microns and larger than 0.5 micron.

4. The electronic assembly of claim 1, wherein an average thickness of the metal coating layer coated over the upper surface of the electronic assembly is t1, wherein an average thickness of the metal coating layer coated over the side surfaces of the electronic assembly is t2, wherein t1/t2 exceeds 0.2 and is less than or equal to 5.

5. The electronic assembly of claim 1, wherein the metal coating layer is directly disposed on the cover layer, and is directly bonded to the cover layer.

6. The electronic assembly of claim 1, further comprising: a second metal foil layer bonded to the metal coating layer and the cover layer, and disposed between the metal coating layer and the cover layer, wherein the second metal foil layer has a length and a width which are substantially coextensive with the circuit board.

7. The electronic assembly of claim 1, further comprising: one or more electric conductive ground connectors which are embedded in the electronic assembly, and are extended toward one or more side surfaces of the electronic assembly to physically, electrically contact the metal coating layer coated over the side surfaces of the electronic assembly.

8. The electronic assembly of claim 1, wherein the cover layer comprises:
   a taper portion; and
   a center portion which is enclosed by the taper portion and is substantially planar,
   wherein the taper portion tapers from the center portion toward the edges of the electronic assembly, and a thickness of the taper portion is reduced.

9. An electronic assembly comprising:
   a circuit board comprising a plurality of electric conductive connectors, and at least one electric conductive ground connector extended toward a side surface of the electronic assembly;
   first and second semiconductor integrated circuits coupled to a first main surface and a second main surface of the circuit board that face each other, respectively;
   first and second cover layers which enclose and planarize the first and second semiconductor integrated circuits, respectively, and are disposed on the first and second semiconductor integrated circuits, respectively;
   a plurality of solder bumps disposed on the second main surface of the circuit board in order to provide an electric connection to the electronic assembly;
   a first metal foil layer bonded to the second cover layer; and
   a metal coating layer which is conformally coated over an upper surface of the electronic assembly on the first main surface of the circuit board, and is extended toward the second main surface of the circuit board across edges of the electronic assembly in order to physically, electrically contact the metal foil layer and the at least one electric conductive ground connector, and to coat the side surfaces of the electronic assembly,
   wherein the first and second semiconductor integrated circuits are electrically connected with the plurality of electric conductive connectors and the plurality of solder bumps,
   wherein the first metal foil layer, the cover layer comprise cut portions which are aligned to expose the plurality of solder bumps,
   wherein the first metal foil layer, the first and second cover layers have a length and a width which are coextensive with the circuit board.

10. A method for fabricating an electronic assembly, the method comprising:
   a step of forming an article;
   a step of dividing the article into a plurality of divided articles; and
   a step of forming an electric conductive layer for an at least one divided article,
   wherein the step of forming the article comprises:
      a step of providing a circuit board comprising a plurality of segments, each of the plurality of segments comprising: a first side portion on a first main surface of the circuit board and a second side portion on a second main surface of the circuit board which faces the second main surface; an electric conductive ground connector embedded in the plurality of segments; a plurality of spaced semiconductor integrated circuits coupled to the first side portion of the segment; and a plurality of solder bumps on the second side portion of the plurality of segments;
      a step of disposing a cover layer on the circuit board in order to cover the plurality of spaced semiconductor integrated circuits in each of the plurality of segments; and
      a step of bonding a first metal foil layer, the first metal foil layer being bonded to the second side portion of each of the plurality of segments and covering the second side portion, the first metal foil layer comprising a plurality of penetrating holes on the second side portion of each of the plurality of segments to allow one of the plurality of penetrating holes to expose the plurality of solder bumps on the second side portion of the plurality of segments,
   wherein each of the divided articles comprises at least one segment of the circuit board,
   wherein, at the step of forming the electric conductive layer,
   the electric conductive layer is formed on an upper surface of the divided articles that is opposite to the first metal foil layer of the at least one divided article to physically, electrically contact the first metal foil layer, and to be electrically extended, continuously going over side surfaces and upper edges of the at least divided article.

11. The method of claim 10, wherein the electric conductive layer comprises metal.

12. The method of claim 10, wherein the step of dividing the article comprises one or more of saw cutting, laser cutting, water jet cutting, die cutting, scoring, and breaking the article.

* * * * *